US012393093B2

(12) United States Patent
Lapid et al.

(10) Patent No.: US 12,393,093 B2
(45) Date of Patent: Aug. 19, 2025

(54) METHOD FOR ILLUMINATING A SUBSTRATE USING MULTIPLE ACOUSTO OPTICAL DEVICES

(71) Applicant: Applied Materials Israel Ltd., Rehovot (IL)

(72) Inventors: Menachem Lapid, Hashmonaim (IL); Roy Kaner, Rehovot (IL); Itay Langstadter, Nir Eliyahu (IL); Yinnon Glickman, Maale Hahamisha (IL)

(73) Assignee: Applied Materials Israel Ltd., Rehovot (IL)

( * ) Notice: Subject to any disclaimer, the term of this patent is extended or adjusted under 35 U.S.C. 154(b) by 1028 days.

(21) Appl. No.: 17/323,916

(22) Filed: May 18, 2021

(65) Prior Publication Data

US 2022/0373858 A1 Nov. 24, 2022

(51) Int. Cl.
*G02F 1/33* (2006.01)
*G01N 21/17* (2006.01)
(Continued)

(52) U.S. Cl.
CPC ............ *G02F 1/33* (2013.01); *G01N 21/1702* (2013.01); *G01N 21/9505* (2013.01);
(Continued)

(58) Field of Classification Search
CPC .. G02F 1/33; G01N 21/1702; G01N 21/9505; G01N 21/8806; G01N 21/9501;
(Continued)

(56) References Cited

U.S. PATENT DOCUMENTS 3,882,273 A * 5/1975 Knox ..................... G02F 1/33
359/311
7,053,395 B2 5/2006 Feldman et al.
(Continued)

FOREIGN PATENT DOCUMENTS

CN 103197422 A 7/2013

OTHER PUBLICATIONS

U.S. Appl. No. 17/323,911 Non-Final Office Action mailed Jan. 26, 2024, 16 pages.
(Continued)

*Primary Examiner* — Thomas K Pham
*Assistant Examiner* — Justin W. Hustoft
(74) *Attorney, Agent, or Firm* — Kilpatrick Townsend & Stockton LLP

(57) ABSTRACT

A method and a system for illuminating a substrate, the system may include an acousto-optic device (AOD); and an etendue expanding optical module. The AOD may include a surface having an illuminated region; wherein the illuminated region is configured to receive a collimated input beam while being fed with a control signal that causes the illuminated region to output illuminated region output beams that are collimated and exhibit deflection angles that scan, during a scan period, a deflection angular range. The etendue expanding optical module is configured to convert the illuminated region output beams to collimated output beams that impinge on an output aperture; wherein a collimated output beam has a width that exceeds a width of an illuminated region output beam; and wherein the etendue expanding optical module comprises a Dammann grating that is configured to output diffraction patterns, each diffraction pattern comprises diffraction orders that cover a continuous angular range.

17 Claims, 6 Drawing Sheets

(51) Int. Cl.
  *G01N 21/95*     (2006.01)
  *G02B 27/12*     (2006.01)
  *G02B 27/30*     (2006.01)
  *H01L 21/67*     (2006.01)

(52) U.S. Cl.
  CPC ............ *G02B 27/12* (2013.01); *G02B 27/30* (2013.01); *H01L 21/67288* (2013.01); *G01N 2021/1706* (2013.01); *G01N 2201/0633* (2013.01); *G01N 2201/0635* (2013.01)

(58) Field of Classification Search
  CPC ... G01N 2021/1706; G01N 2201/0633; G02B 27/12; G02B 27/30; G02B 21/002
  See application file for complete search history.

(56) References Cited

U.S. PATENT DOCUMENTS

| | | |
|---|---|---|
| 12,092,941 B2 | 9/2024 | Lapid et al. |
| 2013/0278902 A1* | 10/2013 | Chen .................. G03B 21/2066 353/31 |
| 2020/0124408 A1 | 4/2020 | Hill et al. |

OTHER PUBLICATIONS

Machine translated English Translation of CN103197422A, 2013, 17 pages.
U.S. Appl. No. 17/323,911 Notice of Allowance mailed May 22, 2024, 10 pages.

* cited by examiner

METHOD FOR ILLUMINATING A SUBSTRATE USING MULTIPLE ACOUSTO OPTICAL DEVICES

BACKGROUND

A variety of systems are used for automated inspection of semiconductor wafers, in order to detect defects, particles and/or patterns on the wafer surface as part of a quality assurance process in semiconductor manufacturing processes. It is a goal of current inspection systems to have high resolution and high contrast imaging in order to provide the reliability and accuracy demanded in sub-micron semiconductor manufacturing processes. However, it is also important to have a high-speed process that permits a large volume throughput so that the quality and assurance processes do not become a bottleneck in the wafer production process. Accordingly, the optical inspection systems must use shorter wave lengths, higher numerical aperture optics and high density image capture technology in order to enable the processing of data from such systems at sufficiently high rates that will satisfy the desired product throughput requirements.

Higher numerical aperture values allows to visualize finer details. Higher field of view allow to increase the throughput of the system.

U.S. Pat. No. 7,053,395 illustrates a wafer detection system that includes a traveling lens acousto-optic device that has an active region. An input beam illuminates the entire active region and a RF input signal is applied to the active region to selectively generate plural traveling lenses in the active region. The plural traveling lenses focuses the input beam to generate plural flying spot beams, at the respective focus of each of the generated traveling lenses. The area of an illuminated surface of the active region well exceeds the aggregate area of the plural traveling lenses—thus reducing the energy usage efficiency of the system.

This leads to a reduction in the overall etendue of the wafer detection—thereby limiting a low numerical aperture (NA) and/or a small field of view.

There is a growing need to provide a highly effective system and method for focusing a beam on a substrate.

SUMMARY

There may be provided a method, and a system for illuminating a substrate.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
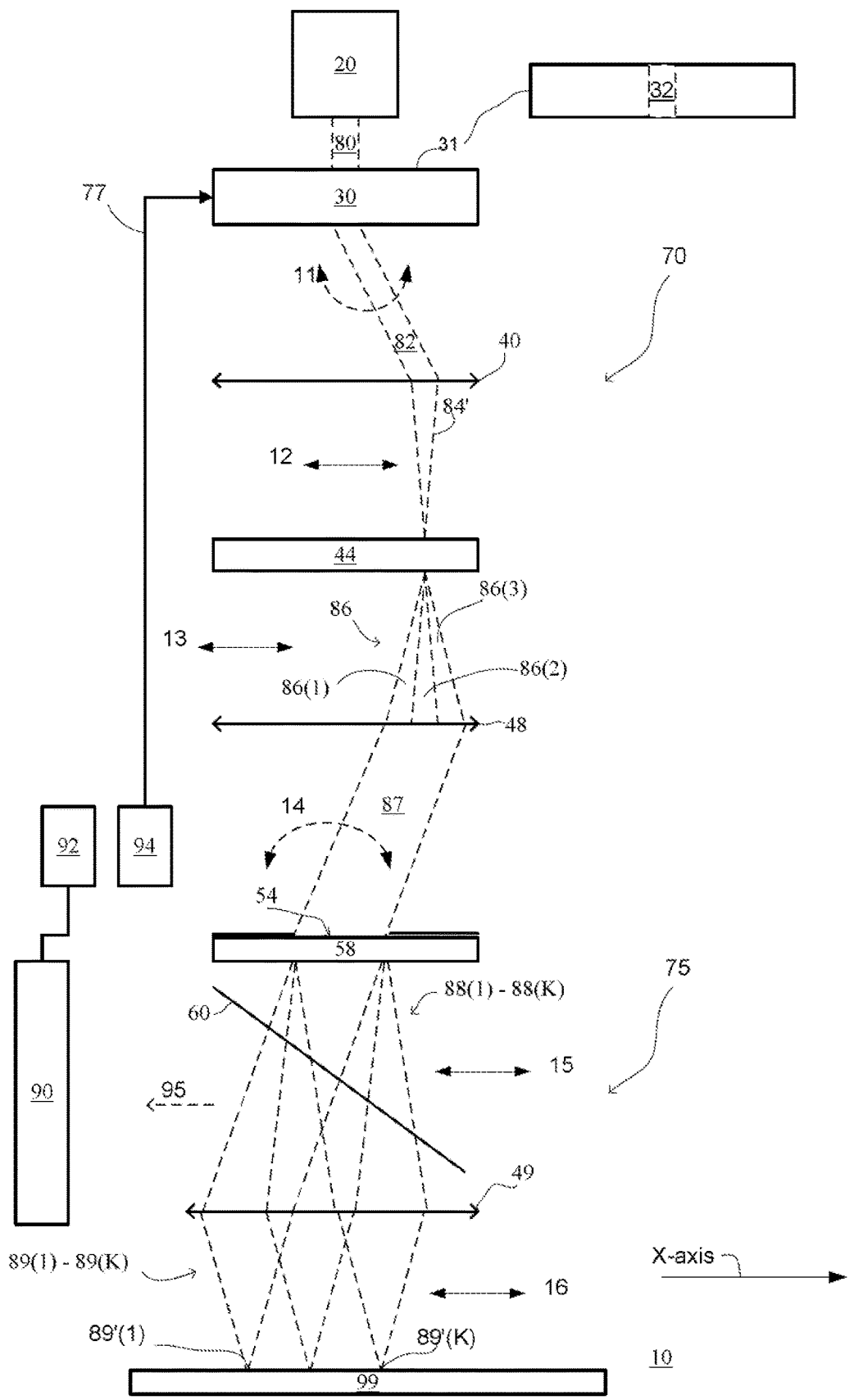
FIG. 1 illustrates an example of a system.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

There may be provided systems and methods that may increase the etendue and allow systems with higher throughput and also may exhibit a better energy efficiency.

For simplicity of explanation the same reference numbers may be sued to describe a single element and a plurality of said elements.

It should be noted that the figures illustrate beams at a certain point in time. A single beam of a certain figure may be scanned or otherwise changed over time and can be referred to as a beam or as beams.

Single AOD

Figure 2:
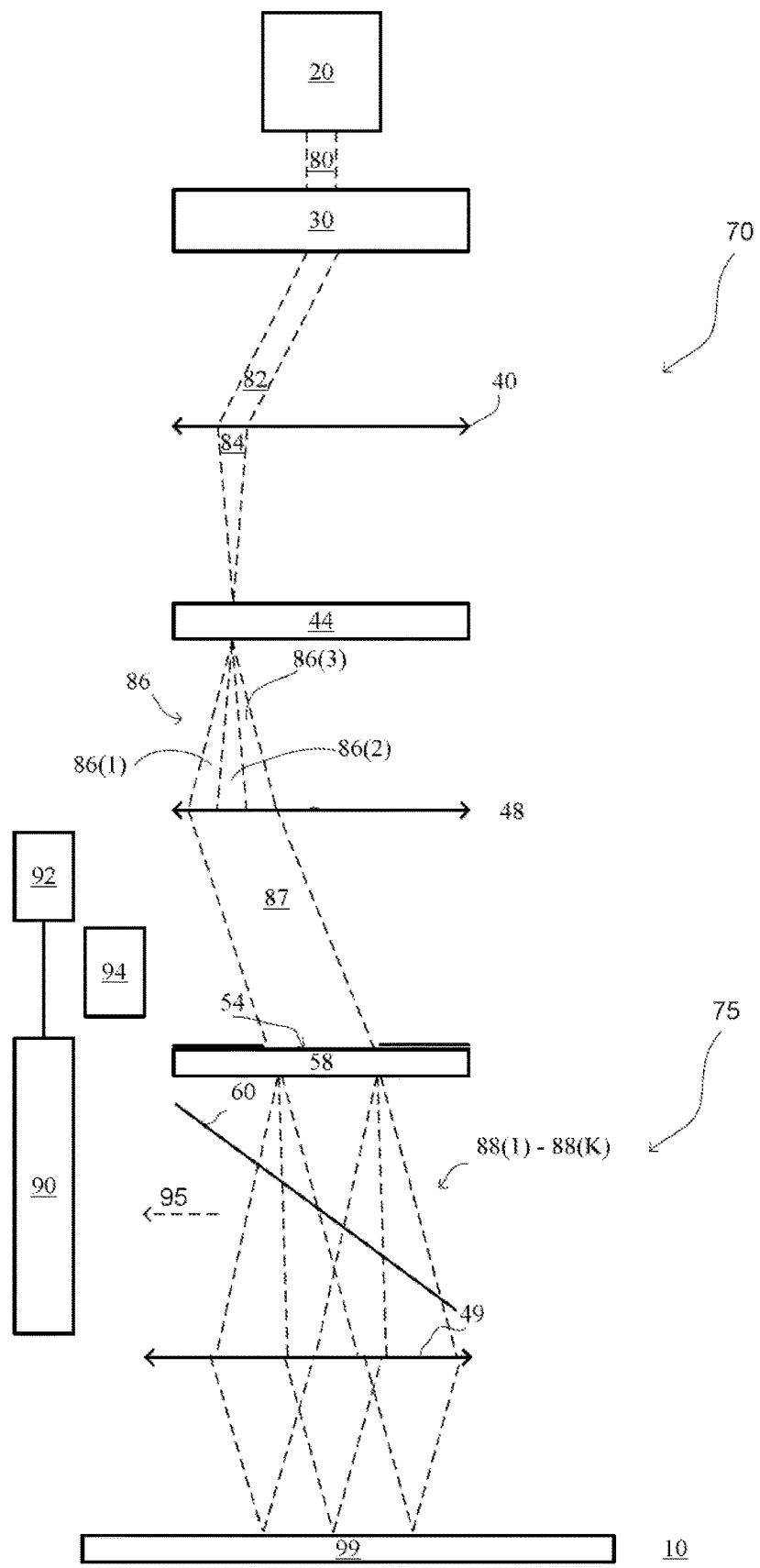
FIG. 2 illustrates an example of a system.

FIGS. 1 and 2 illustrates system 10 at two different points of time. The two points of time represent a start and an end of a scan period. The system may scan a region (for example a line) of a substrate during a scan period. The system may perform multiple scans during multiple scan periods. During the multiple scan periods a movement may be introduced between the system (or at least the optics of the system) and the substrate.

System 10 may be configured to illuminate the substrate. System 10 may also be configured to detect radiation from the substrate. System 10 may also be configured to evaluate the substrate—for example perform inspection, defect detection and/or any other evaluation of the substrate.

The illumination path of the system may perform multiple types of scans—where one scan may be converted to another scan. FIG. 1 illustrates angular scanning (see arrows 11 and 14 that represent the angular scan), and linear scanning (see arrows 12, 13, 15 and 16 that represent the linear scan). The linear scanning may be along the x-axis of the figure or along any other axis. Any angular range illustrated in FIG. 1 may be of any value. Any linear scan may scan along a scan path of any length.

In FIG. 1, the system 10 is illustrated as including a light source 20, an acousto-optic device (AOD) 30 that is controlled by control signal 77 sent from controller 94, an etendue expanding optical module 70 and an output module 75.

The AOD 30 has a surface 31 having an illuminated region 32. The illuminated region 32 is configured to receive a collimated input beam (from the light source 20) while the AOD is being fed with control signal 77.

The area of the illuminated region 32 is a fraction (for example—less than 30, 20, 10, 5, 1 percent) of an area of the surface 31. The radiation source may be configured to avoid illuminating the surface outside the illuminated region.

Control signal 77 causes the illuminated region 32 to output illuminated region output beams 82 that are collimated and exhibit deflection angles that scan, during a scan period, a deflection angular range (see arrow 11).

The rightmost deflection angle of the deflection angular range is shown in FIG. 1. The leftmost deflection angle of the deflection angular range is shown in FIG. 2.

The deflection angular range may be less than one degrees or more than 1, 5, 10, 20, 25, 30, 35, 40, 45, 50 degrees and even more.

The etendue expanding optical module 70 is configured to convert the illuminated region output beams 82 to collimated output beams 87 that impinge on an output aperture 54.

Different collimated output beams exhibit different angles of impingement (see arrow 14). The leftmost tilted collimated output beam is shown in FIG. 1. The rightmost tilted collimated output beam is shown in FIG. 2.

A collimated output beam has a width (the width may be measured along the x-axis of the figure) that exceeds a width of an illuminated region output beam.

The etendue expanding optical module 70 includes a Dammann grating 44 that is configured to output diffraction patterns 86. Each diffraction pattern includes diffraction orders (such as first diffraction order 86(1), second diffraction order 86(2) and third diffraction order 86(3)) that cover a continuous angular range. The diffractions orders may partially overlap or may not-overlap but formed without a gap between them. The number of diffraction orders may be two or may exceed three.

The etendue expanding optical module 70 includes a Dammann grating 44 that is configured to output diffraction patterns 86. Each diffraction pattern includes diffraction orders (such as first diffraction order 86(1), second diffraction order 86(2) and third diffraction order 86(3)) that cover a continuous angular range. The diffractions orders may partially overlap or may not-overlap but formed without a gap between them. The number of diffraction orders may be two or may exceed three.

In FIG. 1, the etendue expanding optical module 70 also includes (i) a cylindrical lens 40 that precedes the Dammann grating, and (b) a spherical lens 48 that follows the Dammann grating.

The Dammann grating is located at a back focal plane of the spherical lens 48 and at the front focal plane of the cylindrical lens 40.

The cylindrical lens 40 is configured to focus the illuminated region output beams 82 onto the Dammann grating to provide focused beams 84'.

Focused beams of different deflection angles impinge on different locations of the Dammann grating, during the scan period.

The rightmost focused beam is shown in FIG. 1. The leftmost focused beam is shown in FIG. 2.

The Dammann grating 44 is configured to illuminate the spherical lens 48 with the diffraction patterns. Different diffraction patterns impinge on different locations of the spherical lens 48, during the scan period.

The rightmost diffraction patterns is shown in FIG. 1. The leftmost diffraction patterns is shown in FIG. 2.

The system 10 has an output aperture 54 that is located at a front focal plane of the spherical lens 48. The spherical lens is configured to convert, during the scan period, the diffraction patterns to the collimated output beams 87.

The leftmost tilted collimated output beam is shown in FIG. 1. The rightmost collimated output beam is shown in FIG. 2. The angular range of the tilt is illustrated by arrow 14.

System 10 may include an output module 75. The output module 75 is configured to convert the collimated output beams 87 to spaced apart spots (such as 89' (1) and 89' (K)) on the substrate 99.

Different linear array of spots scan a linear region of the substrate during the scan period. The scan can be along the x-axis of the figure.

FIG. 1 illustrates the output module as including output Dammann grating 58 and objective lens 49.

The output Dammann grating 58 is configured to receive the collimated output beams 87, and provide output diffraction patterns (such as 88(1)-88(K)) that are converted by the objective lens 49 to focused output beams (such as 89(1)-89(K)) that form spaced apart spots (such as 89' (1) and 89' (K)) on the substrate. The focused output beam perform a linear scan-see arrow 15.

It should be noted that each collimated output beam 87 includes multiple (K) rays—and for simplicity of explanation only the rightmost ray and the leftmost ray were illustrated. The rays are located between the rightmost ray and the leftmost ray.

For simplicity of explanation FIG. 1 illustrates only the rightmost focused output beam 88(K), the leftmost focused output beam 88(1), the rightmost spot 89' (1), and the leftmost spot 89' (K).

The focused output beam and the spots may linearly scan the substrate 99—see arrow 16.

FIG. 1 also illustrates the system 10 as including beam splitter 60, one or more detectors 90, processing circuit 92 and controller 94.

The one or more detectors 90 are configured to generate detection signals indicative of radiation from the substrate that resulted from a formation of the spaced apart spots on the substrate. The radiation may impinge on beam splitter 60 and be directed (see arrow 95) towards the one or more detectors 90.

The processing circuit 92 may perform defect detection, or any other measurement or evaluation related to the substrate.

Figure 3:
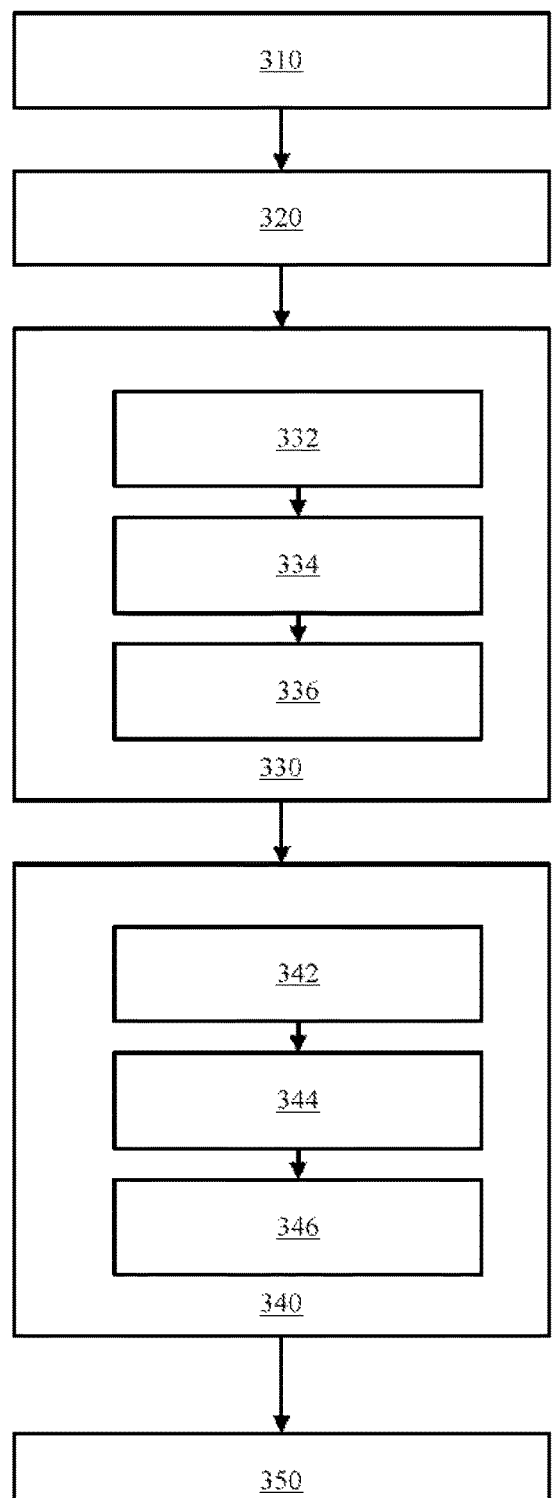
FIG. 3 illustrates an example of a method.

FIG. 3 illustrates an example of a method 300 for illuminating a substrate.

Method 300 may start by step 310 of illuminating an illuminated region of a surface of an active region of an acousto-optic device with a collimated input beam while feeding the acousto-optic device with a control signal that causes the illuminated region to output illuminated region output beams that are collimated and exhibit deflection angles that scan, during a scan period, a deflection angular range.

An area of the illuminated region is a fraction of an area of the surface, and the method may include avoiding from illuminating the surface outside the illuminated region.

Step 310 may be followed by step 320 of receiving the illuminated region output beams by an etendue expanding optical module.

Step 320 may be followed by step 330 of converting the illuminated region output beams, by the etendue expanding optical module, to collimated output beams that impinge on an output aperture. The collimated output beam has a width that exceeds a width of an illuminated region beam.

Step 330 may include steps 332, 334 and 336.

Step 332 may include focusing the illuminated region output beams, by a cylindrical lens of the etendue expanding optical module, onto a Dammann grating to provide focused beams.

The Dammann grating may be located at a back focal plane of a spherical lens.

Focused beams of different deflection angles impinge on different locations of the Dammann grating, during the scan period.

Step 334 may include outputting diffraction patterns, by the Dammann grating. Each diffraction pattern may include diffraction orders that cover a continuous angular range.

Step 334 may also include illuminating a spherical lens of the etendue expanding optical module with the diffraction patterns, by the Dammann grating.

Different diffraction patterns impinge on different locations of the spherical lens, during the scan period.

Step 336 may include converting, by the spherical lens and during the scan period, the diffraction patterns to the collimated output beams. The collimated output beams impinge on an output aperture that is located at a front focal plane of the spherical lens.

Step 330 may be followed by step 340 of converting, by an output module, the collimated output beams to spaced apart spots on the substrate.

Different linear array of spots scan a linear region of the substrate during the scan period.

Step 340 may include steps 342, 344 and 346.

Step 342 may include illuminating an output Dammann grating with the collimated output beams.

Step 344 may include outputting, by the output Dammann grating, output diffraction patterns.

Step 346 may include converting the output diffraction patterns, by an objective lens, to form the spaced apart spots.

Step 340 may be followed by step 350 of obtaining detection signals indicative of radiation from the substrate that resulted from a formation of the spaced apart spots on the substrate.

Steps 310, 320, 330 may be repeated for each one of multiple scan periods. The same applied to steps 310, 320, 330, 340 and 350.

Multiple AODs

Figure 4:
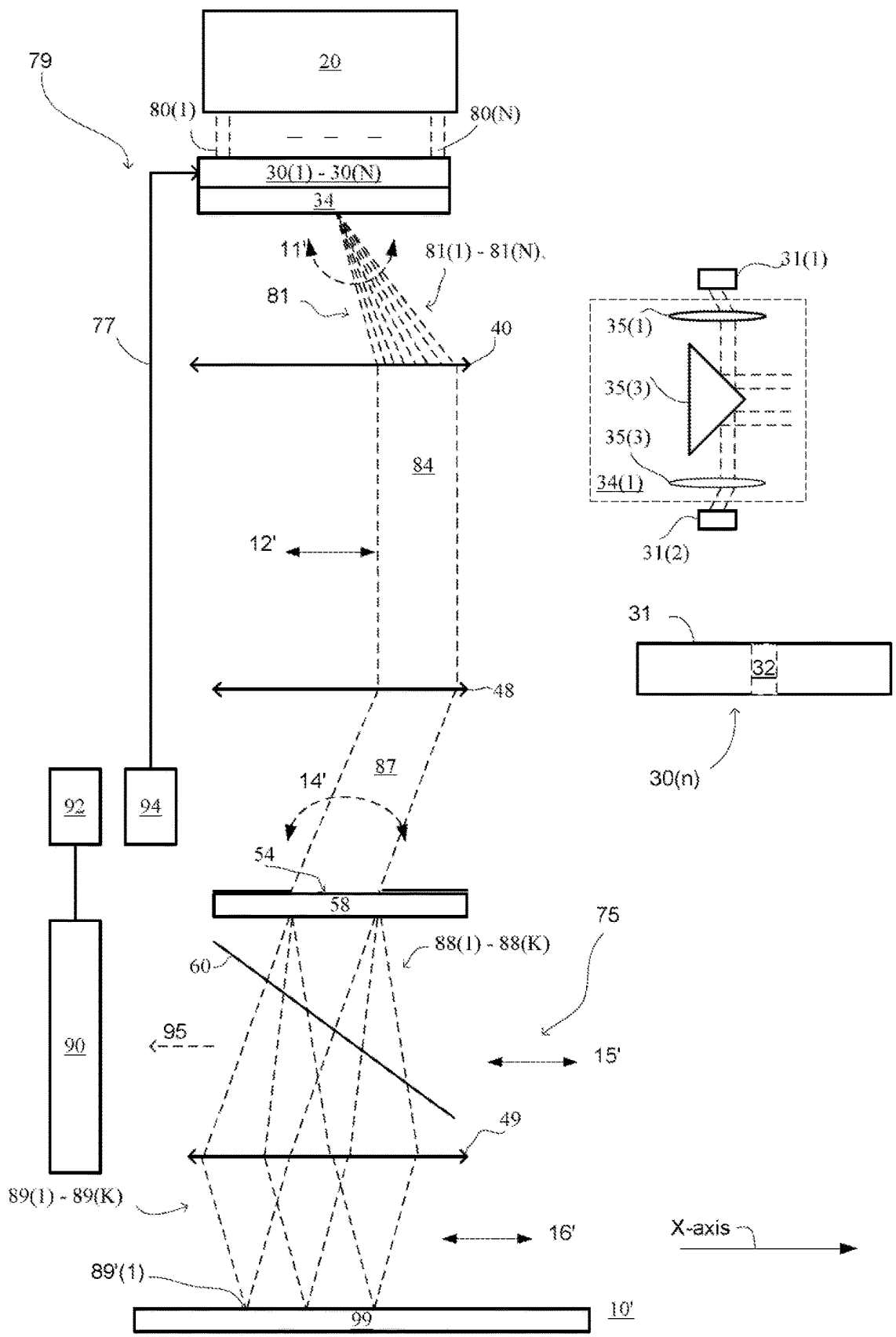
FIG. 4 illustrates an example of a system.
Figure 5:
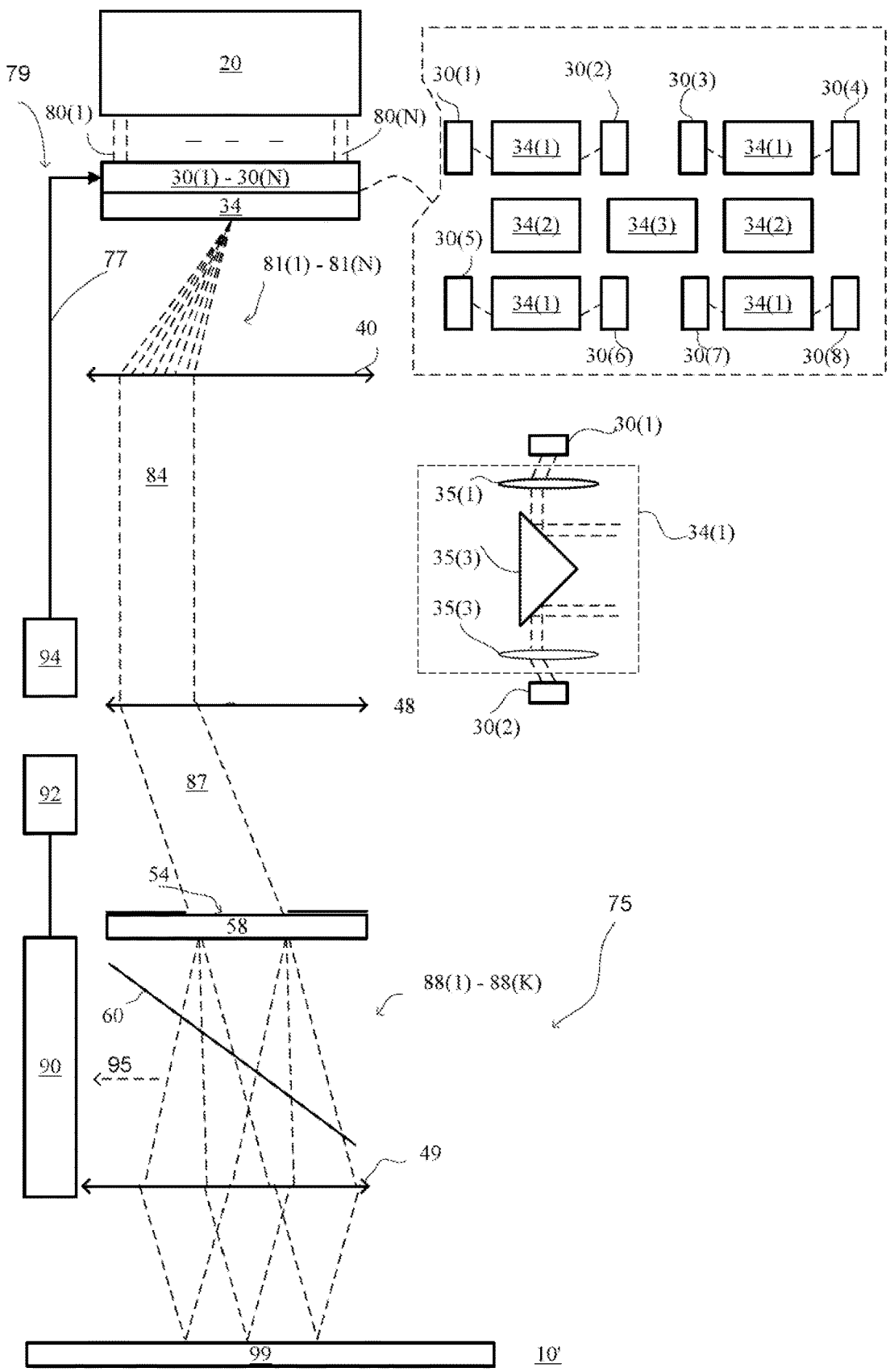
FIG. 5 illustrates an example of a system.

FIGS. 4 and 5 illustrate system 10', at two different points of time that represent a start and an end of a scan period. The system may scan a region (for example a line) of a substrate during a scan period. The system may perform multiple scans during multiple scan periods—while a movement is introduced between the system and the substrate.

System 10' may be configured to illuminate the substrate. System 10' may also be configured to detect radiation from the substrate. System 10' also be configured to evaluate the substrate—for example perform inspection, defect detection and/or any other evaluation of the substrate.

FIG. 4 illustrates angular scanning (see arrows 11' and 14' that represent the angular scan), and linear scanning (see arrows 12', 15' and 16' that represent the linear scan). The linear scanning may be a long the x-axis of the figure or along any other axis. Any angular range illustrated in FIG. 1 may be of any value. Any linear scan may scan along a scan path of any value.

In FIG. 4 the system 10 is illustrates as including a light source 20, acousto-optic devices (AODs) 30(1)-30(N)—each is controlled (by control signal 77 sent from controller 94), relay module 79 and an output module 75.

Each AOD has a surface having an illuminated region. For example—see AOD 30 ($n$), n ranges between 1 and N. AOD 30 ($n$) has surface 31 and illuminated region 32. The N illuminated regions are configured to concurrently receive a collimated input beam (80(1)-80(N) from the light source 20) while the AOD is being fed with control signal 77.

The area of each illuminated region 32 is a fraction (for example-less than 30, 20, 10, 5, 1 percent) of an area of each surface 31. The radiation source may be configured to avoid illuminating the surfaces outside the illuminated regions.

For each AOD of AODs 30(1)-30(N)—a control signal 77 causes the illuminated region 32 to output illuminated region output beams (such as 81(1)-81(N)) that are added by the optical combining module to provide combined beams (such as combined beam 81—one combined beam at a time), whereas each combined beam covers a continuous angular range.

System 10' may also include relay module 79 that images an output plane of the optical combining module 34 onto an output aperture 54 of the system.

A combined beam 81 impinges on cylindrical lens 40 that converts the combined beam 81 to an intermediate collimated beam 84. The intermediate collimated beam 84 impinges on the spherical lens 48 that outputs an output collimated beam onto the output aperture 54.

The different combined beams exhibit, at the output plane of the optical combining module, different deflection angles—as illustrated by arrow 11'. The different deflection angles cause the different combined beams to impinge on different locations of the cylindrical lens 40—to perform a linear scan—see arrow 12'. Different output collimated beams impinge on the output aperture 54 at different angles—as shown in arrow 14'.

System 10' may include an output module 75. The output module 75 is configured to convert the collimated output beams (such as collimated output beam 87) to spaced apart spots (such as 89' (1) and 89' (K)) on the substrate 99.

Different linear array of spots scan a linear region of the substrate during the scan period. The scan can be along the x-axis of the figure.

FIG. 4 illustrates the output module as including output Dammann grating 58 and objective lens 49.

The output Dammann grating 58 is configured to receive the collimated output beams (such as output collimated beam 87), and provide output diffraction patterns (such as 88(1)-88(K)) that are converted by the objective lens 49 to focused output beams (such as 89(1)-89 (K)) that form spaced apart spots (such as 89' (1) and 89' (K)) on the substrate.

It should be noted that each collimated output beam 87 include multiple (K) rays and for simplicity of explanation only the rightmost ray and the leftmost ray were illustrated. The rays range between the rightmost ray and the leftmost ray. For simplicity of explanation FIG. 4 illustrated only the rightmost focused output beam 88(K), the leftmost focused output beam 88(1), the rightmost spot 89' (1), and the leftmost spot 89' (K). The focused output beam perform a linear scan-see arrow 15'.

The focused output beams and the spots may linearly scan the substrate 99—see arrow 16'.

FIG. 4 also illustrates the system 10' as including beam splitter 60, one or more detectors 90 and a processing circuit 92.

The one or more detectors 90 are configured to generate detection signals indicative of radiation from the substrate that resulted from a formation of the spaced apart spots on the substrate. The radiation may impinge on beam splitter 60 and be directed towards the one or more detectors 90.

FIG. 4 also illustrates a combiner 34(1) that is illuminated by first AOD 30(1) and second AOD 30(2). The combiner 34(1) may include a prism 35(3), a first lens 35(1) and a second lens 35(3). Other combiners may be used.

FIG. 5 illustrates an optical combining module 34 that adds the outputs of eight AODs-30(1)-30(8). The optical combining module 34 includes multiple (for example five) combiners-including first level combiners 34(1) for adding the outputs of two AODs each, second level combiners 34(2) for combining the outputs of two first level combiners each, and a third level combiner 34(3) for combining the outputs of two second level combiners each to output the combined beam.

Figure 6:
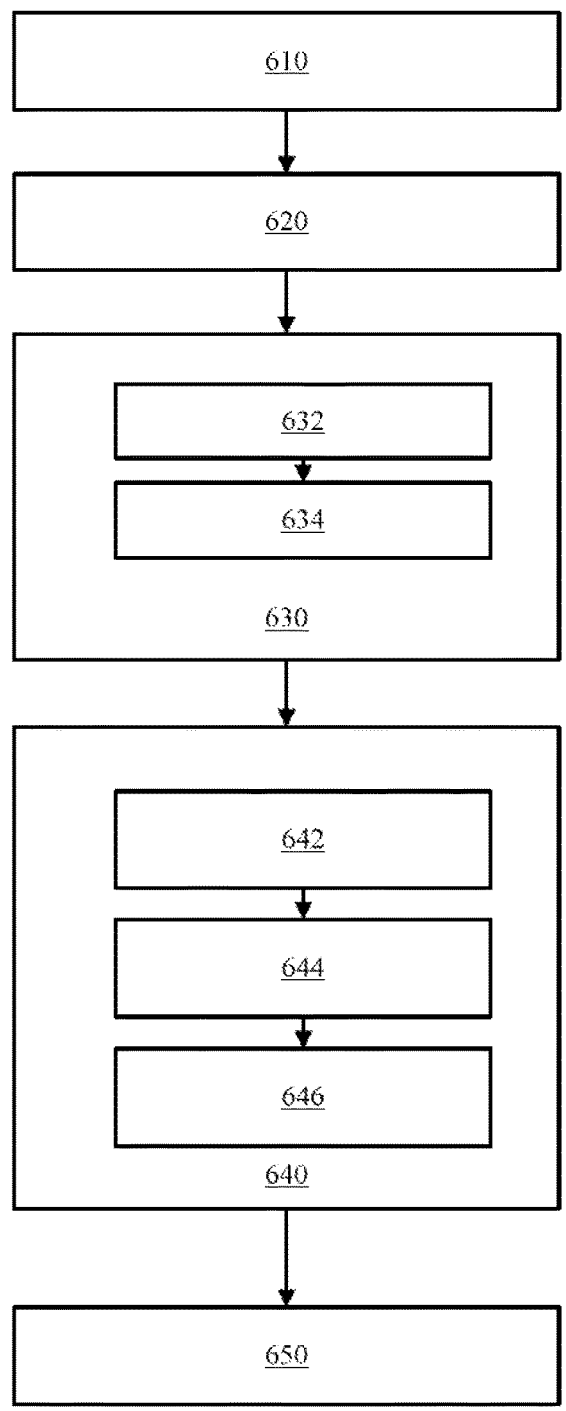
FIG. 6 illustrates an example of a method.

FIG. 6 illustrates method 600 for illuminating a substrate.

Method 600 may start by step 610 of illuminating, concurrently, illuminated regions of acousto-optic devices with collimated input beams while concurrently feeding the acousto-optic devices with control signals that cause the illuminated regions to concurrently output illuminated regions output beams that are collimated and exhibit deflection angles that scan, during a scan period, a deflection angular range.

Step 610 may be followed by step 620 of combining, by an optical combining module, the illuminated regions output beams to provide combined beams (one at a time), each combined beam covers a continuous angular range. Different combined beams exhibit, at the output plane of the optical combining module, different deflection angles.

Step 620 may be followed by step 630 of imaging, by a relay module, an output plane of the optical combining module onto an output aperture of the system.

Step 630 may include steps 632 and 634.

Step 632 may include converting, by a cylindrical lens of the relay module, the combined beams to intermediate collimated beams. Different intermediate collimated beams impinge on different parts of the spherical lens.

Step 634 may include outputting, by the spherical lens, collimated output beams towards the output aperture.

Step 630 may be followed by step 640 of converting, by an output module, the collimated output beams to spaced apart spots on the substrate.

Different linear array of spots scan a linear region of the substrate during the scan period.

Step 640 may include steps 642, 644 and 646.

Step 642 may include illuminating an output Dammann grating with the collimated output beams.

Step 644 may include outputting, by the output Dammann grating, output diffraction patterns.

Step 646 may include converting the output diffraction patterns, by an objective lens, to form the spaced apart spots.

Step 640 may be followed by step 650 of obtaining detection signals indicative of radiation from the substrate that resulted from a formation of the spaced apart spots on the substrate.

Steps 610, 620, 630 may be repeated for each one of multiple scan periods. The same applied to steps 610, 620, 630, 640 and 650.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

We claim:

1. A system for illuminating a substrate, the system comprises:
   a plurality of acousto-optic devices, wherein each acousto-optic device in the plurality of acousto-optic devices comprises a surface having an illuminated region and a region outside the illuminated region, wherein an area of the illuminated region on the surface of each acousto-optic device is less than 30 percent of an area of the surface;
   an illumination source configured to generate a plurality of beams of collimated light and project the plurality of beams of collimated light onto the surfaces of the plurality of acousto-optic devices such that the illuminated region of each acousto-optic device receives a collimated beam of light from the plurality of beams of collimated light without the regions outside the illuminated regions being illuminated;
   an optical combining module;
   an output aperture;
   a relay module that images an output plane of the optical combining module onto the output aperture of the system; and
   an output module;
   wherein illuminated regions of the acousto-optic devices are configured to concurrently receive collimated input beams while the acousto-optic devices are concurrently fed with control signals that cause the illuminated regions to concurrently output illuminated regions output beams that are collimated and exhibit deflection angles that scan, during a scan period, a deflection angular range;
   wherein the optical combining module is arranged to receive the illuminated regions output beams from the acousto-optic devices, and configured to combine the illuminated regions output beams to provide combined beams, each combined beam covers a continuous angular range; wherein different ones of the combined beams exhibit, at the output plane of the optical combining module, different deflection angles;
   wherein the relay module is arranged to receive the combined beams, and configured to output collimated output beams towards the output aperture to image the output plane of the optical combining module onto the output aperture; and
   wherein the output module is arranged to receive the collimated output beams and configured to convert the collimated output beams to spaced apart spots on the substrate.

2. The system according to claim 1 wherein the relay module comprises a cylindrical lens and a spherical lens, the cylindrical lens is configured convert the combined beams to intermediate collimated beams; wherein different ones of the intermediate collimated beams impinge on different parts of the spherical lens.

3. The system according to claim 2 wherein the different ones of the intermediate collimated beams impinge on different locations of the spherical lens, during the scan period.

4. The system according to claim 3 wherein the output aperture is located at a front focal plane of the spherical lens; wherein spherical lens is configured to output the collimated output beams towards the output aperture.

5. The system according to claim 1 wherein different linear array of spots scan a linear region of the substrate during the scan period.

6. The system according to claim 1 where the output module comprises an output Dammann grating and an objective lens; wherein the output Dammann grating is configured to receive the collimated output beams, and provide output diffraction patterns that are converted by the objective lens to the spaced apart spots.

7. The system according to claim 1 comprising one or more detectors that are configured to generate detection signals indicative of radiation from the substrate that resulted from a formation of the spaced apart spots on the substrate.

8. The system according to claim 1 that is configured to illuminate the substrate during multiple repetitions of the scan period.

9. A method for illuminating a substrate, the method comprising:
   generating a plurality of beams of collimated light;
   projecting the plurality of beams of collimated light towards a plurality of acousto-optic devices, wherein each acousto-optic device in the plurality of acousto-optic devices comprises a surface having an illuminated region and a region outside the illuminated region to concurrently illuminate the illuminated regions of the plurality of acousto-optic devices without illuminating the regions outside the illuminated regions while concurrently feeding the acousto-optic devices with control signals, wherein an area of the illuminated region on the surface of each acousto-optic device is less than 30 percent of an area of the surface;
   outputting, concurrently, output illuminated regions output beams from the illuminated regions of the acousto-optic devices, wherein the output illuminated regions are collimated and exhibit deflection angles that scan, during a scan period, a deflection angular range;

combining, by an optical combining module arranged to receive the illuminated regions output beams from the acousto-optic devices, the illuminated regions output beams to provide combined beams, each combined beam covers a continuous angular range; wherein different ones of the combined beams exhibit, at an output plane of the optical combining module, different deflection angles;

receiving, by a relay module, the combined beams and outputting collimated output beams towards an output aperture and imaging the output plane of the optical combining module onto the output aperture; and receiving, by an output module, the collimated output beams and converting the collimated output beams to spaced apart spots on the substrate.

10. The method according to claim 9 comprising converting, by a cylindrical lens of the relay module, the combined beams to intermediate collimated beams; wherein different ones of the intermediate collimated beams impinge on different parts of a spherical lens.

11. The method according to claim 10 wherein the different ones of the intermediate collimated beams impinge on different locations of the spherical lens of the relay module, during the scan period.

12. The method according to claim 11 wherein the output aperture is located at a front focal plane of the spherical lens; wherein the method comprises outputting, by the spherical lens, the collimated output beams towards the output aperture.

13. The method according to claim 9 wherein different linear array of spots scan a linear region of the substrate during the scan period.

14. The method according to claim 9 where the converting comprises:
    illuminating an output Dammann grating with the collimated output beams;
    outputting, by the output Dammann grating, output diffraction patterns; and
    converting the output diffraction patterns, by an objective lens, to form the spaced apart spots.

15. The method according to claim 9 comprising obtaining detection signals indicative of radiation from the substrate that resulted from a formation of the spaced apart spots on the substrate.

16. The method according to claim 9 comprising repeating the illuminating, receiving and converting for each one of multiple scan periods.

17. A system for illuminating a substrate, the system comprising:
    an illumination source configured to concurrently generate a plurality of beams of collimated light;
    a plurality of acousto-optic devices corresponding in number to the plurality of beams of collimated light, each acousto-optic device in the plurality of acousto-optic devices comprising a surface having an illuminated region and a region surrounding the illuminated region, wherein the illumination source is arranged to project the plurality of beams of collimated light onto the illuminated regions of the plurality of acousto-optic devices without illuminating the regions surrounding the illuminated regions such that the illuminated region of each acousto-optic device receives a different collimated beam of light from the plurality of beams of collimated light, wherein for each acousto-optic device, the illuminated region is less than 30 percent of the surface of the acousto-optic device;
    a controller operatively coupled to send control signals to the plurality of acousto-optic devices to, while the plurality of acousto-optic devices concurrently receive the plurality of beams of collimated light from the illumination source, cause the illuminated regions to concurrently output illuminated region output beams that are collimated and exhibit deflection angles that scan, during a scan period, a deflection angular range;
    an optical combining module arranged to receive the illuminated region output beams from the plurality of acousto-optic devices and configured to combine the illuminated region output beams to provide a plurality of combined beams, wherein each combined beam covers a continuous angular range, and wherein different ones of the plurality of combined beams exhibit, at an output plane of the optical combining module, different deflection angles;
    an output aperture;
    a relay module arranged to receive the plurality of combined beams and configured to output collimated output beams towards the output aperture to image the output plane of the optical combining module onto the output aperture; and
    an output module arranged to receive the collimated output beams through the output aperture and configured convert the collimated output beams to spaced apart spots on the substrate.

* * * * *